US008645883B2

(12) United States Patent
Korobkov et al.

(10) Patent No.: US 8,645,883 B2
(45) Date of Patent: Feb. 4, 2014

(54) INTEGRATED CIRCUIT SIMULATION USING FUNDAMENTAL AND DERIVATIVE CIRCUIT RUNS

(75) Inventors: Alexander Korobkov, San Jose, CA (US); Wai Chung William Au, San Jose, CA (US); Subramanian Venkateswaran, Santa Clara, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 13/466,295

(22) Filed: May 8, 2012

(65) Prior Publication Data

US 2013/0305201 A1 Nov. 14, 2013

(51) Int. Cl.
*G06F 17/50* (2006.01)
*G06F 17/10* (2006.01)

(52) U.S. Cl.
USPC ........... 716/108; 716/104; 716/105; 716/106; 716/113; 703/2; 703/14

(58) Field of Classification Search
USPC ......... 716/104, 105, 106, 108, 113; 703/2, 14
See application file for complete search history.

(56) References Cited

U.S. PATENT DOCUMENTS

| | | | | |
|---|---|---|---|---|
| 6,530,065 | B1 * | 3/2003 | McDonald et al. | 716/102 |
| 7,092,858 | B1 * | 8/2006 | Kukula et al. | 703/2 |
| 7,127,384 | B2 * | 10/2006 | Zolotov et al. | 703/14 |
| 7,286,906 | B2 * | 10/2007 | Richards | 700/286 |
| 7,324,363 | B2 * | 1/2008 | Kerns et al. | 365/63 |
| 7,484,195 | B1 * | 1/2009 | Korobkov | 716/113 |
| 7,584,081 | B2 * | 9/2009 | Wen et al. | 703/2 |
| 7,600,209 | B2 * | 10/2009 | Baumgartner et al. | 716/108 |
| 7,865,348 | B1 | 1/2011 | Au et al. | |
| 7,953,581 | B2 | 5/2011 | Yu et al. | |
| 8,024,051 | B2 | 9/2011 | Korobkov et al. | |
| 8,200,470 | B2 * | 6/2012 | Stanley | 703/14 |
| 8,341,572 | B1 * | 12/2012 | Tiwary et al. | 716/108 |
| 8,341,577 | B1 * | 12/2012 | Korobkov et al. | 716/113 |
| 8,375,343 | B1 * | 2/2013 | Tiwary et al. | 716/113 |
| 2008/0300848 | A1 * | 12/2008 | Beattie et al. | 703/14 |
| 2010/0107133 | A1 * | 4/2010 | Nakagawa et al. | 716/5 |
| 2010/0217569 | A1 | 8/2010 | Korobkov | |
| 2012/0150507 | A1 * | 6/2012 | Gallestey et al. | 703/2 |

OTHER PUBLICATIONS

Dong et al.; "Parallelizable Stable Explicit Numerical Integration for Efficient Circuit Simulation"; ACM 978-1-60558-497-3; pp. 382-385 (Jul. 2009).
Kanj et al.; "Accelerated Statistical Simulatin Via On-Demand Hermite Spline Interpolations"; IIEEE 978-1-4577-1400-9/11; pp. 353-360 (2011).
Visweswariah et al.; "Incremental Event-Driven Simulatin of Digital FET Circuits"; ACM 0-89791-577-1/93/0006-07347; pp. 737-747 (1993).
Nadezhin et al.; "SOI Transistor Model for Fast Transient Simulation"; ACM 1-58113-762-1/03/0011; pp. 120-127 (2003).
Zhou et al.; "Incremental Circuit Simulation Analysis for Design Modification and Verification"; IEEE 978-1-4244-3828-0/09; pp. 2753-2756 (2009).

* cited by examiner

*Primary Examiner* — Helen Rossoshek
(74) *Attorney, Agent, or Firm* — Miles & Stockbridge P.C.

(57) ABSTRACT

A system that simulates an integrated circuit is formed of a plurality of devices. The system initially performs a fundamental circuit simulation run using original parameters for the plurality of devices and an initial time step. The system generates one or more fundamental time steps from the fundamental circuit simulation run. The fundamental time steps are generated when changes that indicate state time derivatives during two or more successive integration steps are within a predetermined range. The system stores the one or more fundamental time steps as fundamental circuit events in an events queue, and updates the parameters for the plurality of devices based on the fundamental circuit events to generate one or more derivative circuits. The system then performs one or more derivative circuit simulation runs using the derivative circuits.

19 Claims, 7 Drawing Sheets

US 8,645,883 B2

INTEGRATED CIRCUIT SIMULATION USING FUNDAMENTAL AND DERIVATIVE CIRCUIT RUNS

FIELD

One embodiment is directed generally to integrated circuit simulation, and in particular to integrated circuit simulation using fundamental and derivative circuit runs.

BACKGROUND INFORMATION

Integrated circuit design has many phases. One such phase is the simulation of the design in which the operation of the integrated circuit is simulated including, for example, simulated logic processing, signal transmission and signal reception. The timing of the integrated circuit design is also simulated. The simulation of the integrated circuit is typically performed by a computer system known as a "test bench." The test bench also includes software for testing the operations of the simulated integrated circuit.

The number of devices (e.g., transistors) on an integrated circuit is ever increasing. Present generations of integrated circuits have millions (and even billions) of devices. The requirement of simulating the local loads and corresponding voltage drops caused by the operations of millions of devices can require several days for the test bench to complete. In order to accurately perform design yield and performance analysis, multiple integrated circuit simulation runs are typically required with different device/transistor parameters applied to represent process, voltage and temperature variations locally and across the integrated circuit. These time consuming simulation runs can greatly increase the design time for a new integrated circuit.

SUMMARY

One embodiment a system that simulates an integrated circuit that is formed of a plurality of devices. The system initially performs a fundamental circuit simulation run using original parameters for the plurality of devices and an initial time step. The system generates one or more fundamental time steps from the fundamental circuit simulation run. The fundamental time steps are generated when changes that indicate state time derivatives during two or more successive integration steps are within a predetermined range. The system stores the one or more fundamental time steps as fundamental circuit events in an events queue, and updates the parameters for the plurality of devices based on the fundamental circuit events to generate one or more derivative circuits. The system then performs one or more derivative circuit simulation runs using the derivative circuits.

DETAILED DESCRIPTION

One embodiment is a system that performs circuit simulation that includes a special purpose event-driven transient analysis, to improve circuit simulation performances in the presence of multiple runs with incremental device/transistor parameters modification. A fundamental circuit simulation run on a fundamental circuit with original parameters generates fundamental circuit events. One or more derivative circuits are derived from the fundamental circuit by updating certain device parameters to accommodate statistical variations. The fundamental circuit events modify the derivative circuit simulation runs on the derivative circuits by adjusting time steps and states for a better performance.

Figure 1:
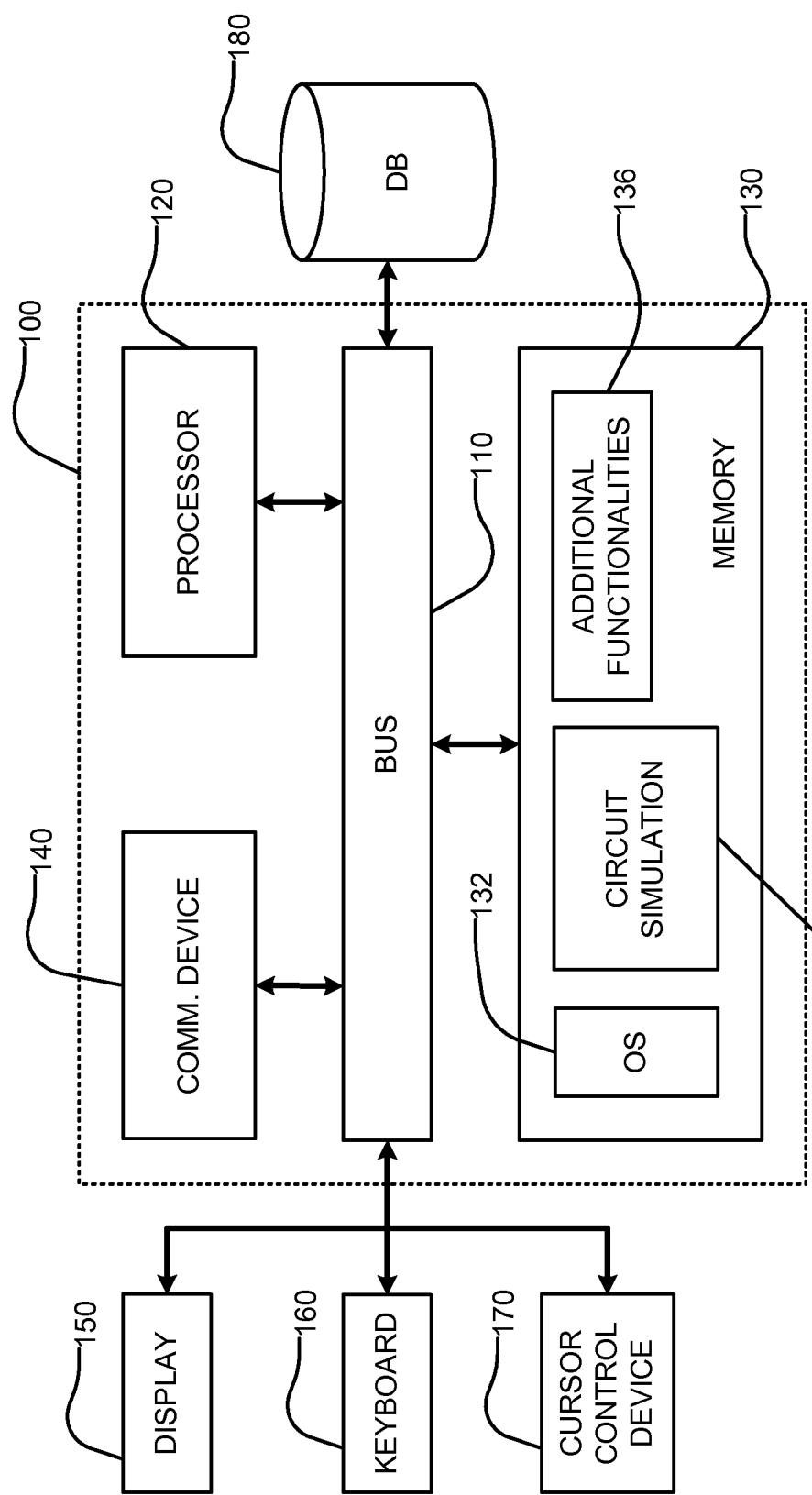
FIG. 1 is a block diagram of a computer system that can implement one embodiment.

FIG. 1 is a block diagram of a computer system 100 that can implement an embodiment. Although shown as a single system, the functionality of system 100 may be implemented as a distributed system. System 100 includes a bus 110 or other communication mechanism for communicating information, and a processor 120 coupled to bus 110 for processing information. Processor 120 can be any type of general or specific purpose processor. System 100 further includes a memory 130 for storing information and instructions to be executed by processor 120. Memory 130 can be comprised of any combination of random access memory ("RAM"), read only memory ("ROM"), static storage such as a magnetic or optical disk, or any other type of computer readable media. System 100 further includes a communication device 140, such as a network interface card, to provide access to a network. Therefore, a user can interface with system 100 directly, or remotely through a network or any other method.

Computer readable media may be any available media that can be accessed by processor 120 and includes both volatile and nonvolatile media, removable and non-removable media, and communication media. The communication media includes computer readable instructions, data structures, program modules or other data in a modulated data signal such as a carrier wave or other transport mechanism and includes any information delivery media. Processor 120 is further coupled via bus 110 to a display 150, such as a Liquid Crystal Display ("LCD"), for displaying information to the user. A keyboard 160 and a cursor control device 170 (e.g., a computer mouse) is further coupled to bus 110 to enable the user to interface with system 100.

In one embodiment, memory 130 may store software modules that can provide functionality when executed by processor 120. Modules includes an operating system ("OS") 132 that can provide OS functionality for system 100. Modules further includes a circuit simulation module 134 for providing circuit simulation functionality, as disclosed in more detail below. System 100 can be part of a larger system, such as a test bed system. Therefore, system 100 can include one or more additional functional modules 136 to include the additional functionality. A database 180 is coupled to bus 110 to provide centralized storage for modules 134 and 136 and store data such as device models, simulation generated data, etc.

In one embodiment, system 100 carries out a circuit simulation on an integrated circuit design. For example, system 100 first performs a simulation run using a "fundamental" or "nominal" circuit (the "fundamental circuit run") where all devices have their original parameters. In one embodiment, the devices are transistors, and the parameters can include the temperature of the device, threshold voltages, etc. The parameters can be received from data associated with the semiconductor technology process for the simulated integrated circuit. During the fundamental circuit run, system 100 identifies and stores various data for each fundamental circuit state variable in an events queue or matrix, which may be stored in memory 130 or database 180. The identified data includes state values where a significant time derivative change occurs so that state time derivatives during two or more successive integration steps are within a predetermined range.

Figure 2:
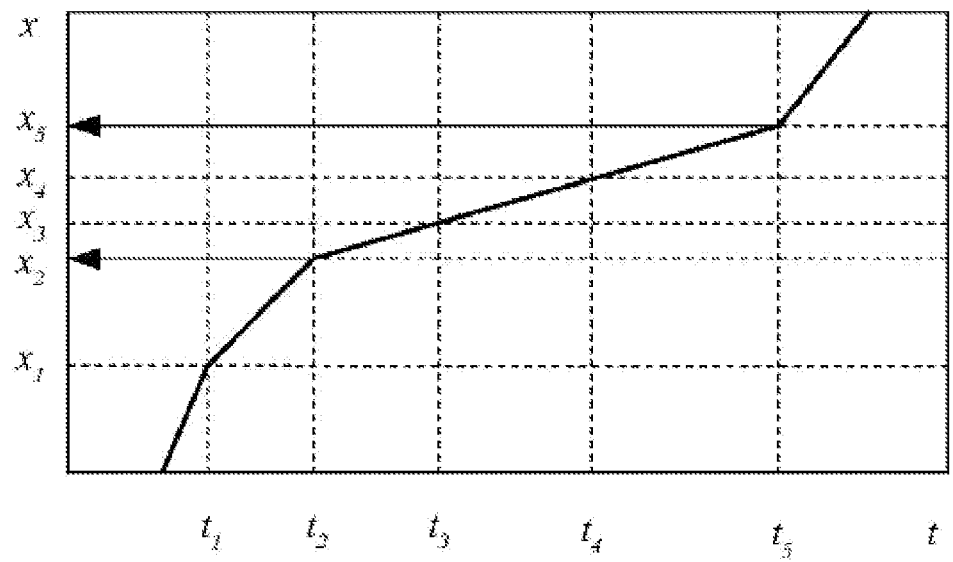
FIG. 2 is a graph showing state values from an example fundamental circuit simulation run in accordance with one embodiment.

For example, FIG. 2 is a graph showing state values from an example fundamental circuit simulation run, in which state value $x_2$ at time $t_2$ and state value $x_5$ at time $t_5$ are identified as fundamental circuit events and stored in the events queue. For the run of FIG. 2, only changes that indicate state time derivatives during two or more successive integration steps are within a predetermined range. In one embodiment, the predetermined range is a relatively small range to limit the number of events. For example, in FIG. 2, only the events at times $t_2$ and $t_5$ are stored. The remaining states can be ignored. In one embodiment, the predetermined range is a user defined value and is typically a very small state (voltage) value range of less than 0.01 volts.

Once the fundamental circuit run is completed, system 100 performs a number of statistical runs using a derivative circuit (a "derivative circuit run"). As disclosed below, in one embodiment the derivative circuit runs are performed in parallel. With each derivative circuit run, system 100 updates the device parameters to represent, for example, a technology process or temperature variation. However, the circuit topology typically remains the same along with the voltage and current sources applied to the primary inputs of the devices. Each derivative circuit run in one embodiment performs transient analysis of the derivative circuit, while incorporating a numerical integration scheme with explicit time step selection for certain states according to the events identified and collected during the fundamental circuit run.

In an embodiment, an event is identified and collected during the fundamental circuit run when the given state value reaches the corresponding fundamental circuit state value stored in the events queue. At the next integration time, an individual time step is selected for the state variable based on the next fundamental circuit event in the events queue. The next time step at integration time $t_k$ where the state variable $x_k$ reaches the value between the fundamental circuit events at corresponding states $\bar{x}_{i-1}$ and $\bar{x}_i$, where $|\bar{x}_{i-1}|<|x_k|<|\bar{x}_i|$, can be calculated as follows:

$$h_{k+1}=(\bar{x}_i-x_k)(t_k-t_{k-1})/(x_k-x_{k-1}) \quad (1);$$

Figure 3:
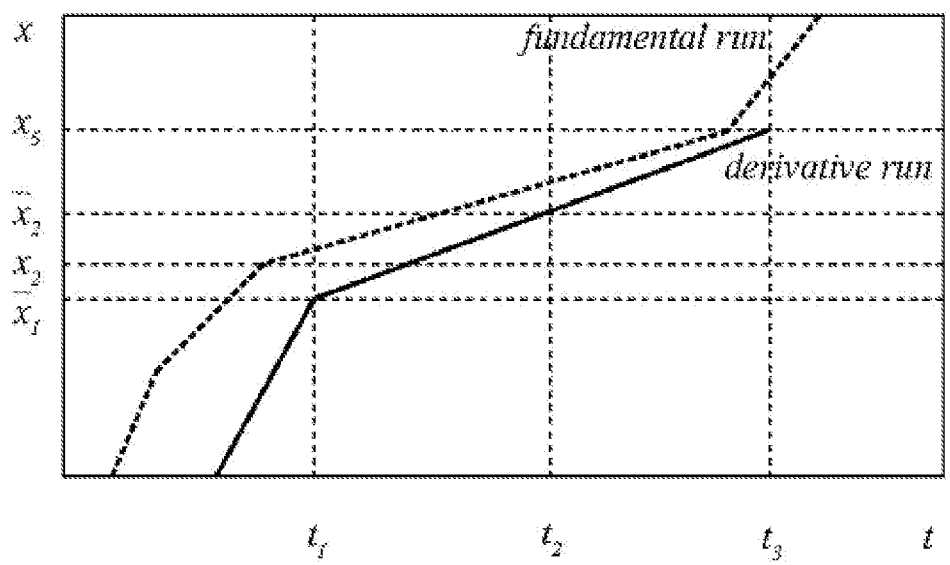
FIG. 3 is a graph illustrating a time step selection in accordance with one embodiment.

For example, FIG. 3 shows the time step selection for the state $\bar{x}_2$ at time $t_2$ from FIG. 2, in which the time step selection is calculated as follows:

$$h=t_3-t_2=(x_5-\bar{x}_2)(t_2-t_1)/(\bar{x}_2-\bar{x}_1) \quad (2)$$

The previous time step derivative from FIG. 2 can be used to estimate the next state value based on the following/next fundamental circuit event using linear extrapolation in one embodiment.

The other circuit states may not fall between any nominal circuit events. In those circumstances, system 100 calculates the other circuit states with a smaller time step using equation (1) above. System 100 then applies the following rules for the time step synchronization:

If a device in the derivative circuit has one or more states that are predicted according to the fundamental circuit events, and a larger integration step is selected, system 100 considers the intermediate states $x_j$ as being fixed at this time and calculates the intermediate states $x_j$ according to the following linear interpolation formula in order to sync up with a smaller time step at $t_k<t_j<t_{k+1}$ for other states and to perform a correct device evaluation:

$$x_j=x_k+(t_j-t_k)(x_{k+1}-t_k)/(t_{k+1}-t_k) \quad (3)$$

If the device has all states predicted according to the fundamental circuit events and requires a larger integration step, the device evaluation is not performed and intermediate states $x_j$ are calculated using equation (3) above to carry out the evaluation for other devices associated with the given state.

For equations 1-3 above, "x" is a circuit state variable (voltage); "t" is a simulation time; "$x_j$" is a state variable value at simulation time "$t_j$"; "h" is a simulation time step (i.e., the difference between simulation time t at k+1 and k points); "k" (or "j") is an index for a simulation time point; and k=0, ... N, where "N" is the total number of simulation points or integration time steps.

Once the states that require a smaller time step reach the closest time point that is predicted using the fundamental circuit events, system 100 recalculates the overall derivative circuit using a known/traditional implicit correction formula (i.e., the actual state values are calculated and the overall time step is determined based on the difference between the predicted state values and the actual state values). If the error exceeds a predetermined user defined tolerance, system 100 reduces the predicted time step and rolls all states back to the closest previous point, and the accuracy is verified in accordance with the known integration procedure.

Figure 4:
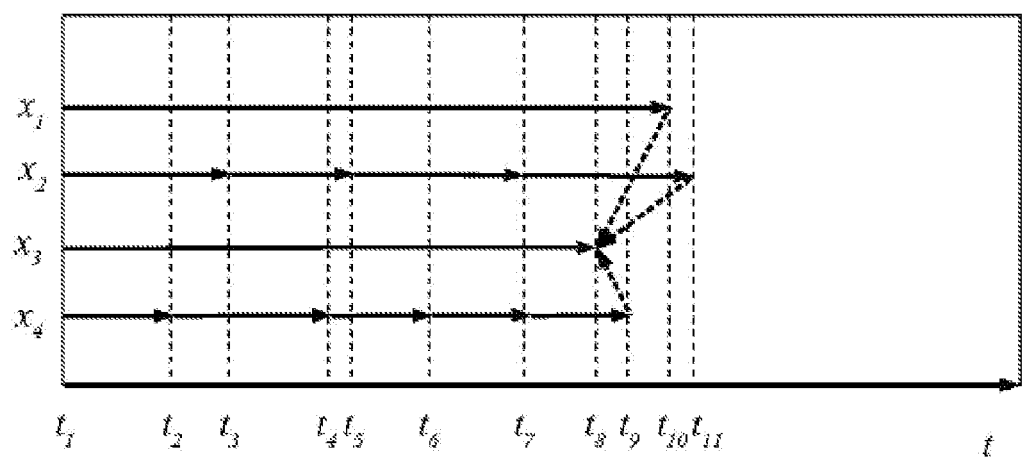
FIG. 4 is a graph illustrating time step synchronization in the presence of the fundamental circuit events in accordance with one embodiment.

An example of the time step synchronization procedure in accordance with one embodiment is shown in FIG. 4, which shows time step synchronization in the presence of fundamental circuit events for the states $x_1$ and $x_3$. Since state $x_3$ has a smaller explicitly predicted time step, all other states (i.e., $x_1$, $x_2$ and $x_4$) are adjusted at time $t_8$ in order to perform the next implicit iteration. If accuracy is not met, all of the states are rolled back to time $t_7$. It is assumed that a stability criteria is satisfied for all time points during the fundamental circuit run. For the derivative circuits, the stability of the explicit prediction formula can be verified using a known prediction-correction implicit scheme once synchronization is performed across all states.

Embodiments can also be used with "delta circuits" in which time domain integration is performed using the differential state variables $\Delta x=\bar{x}-x$. Delta circuits are disclosed in, for example, Zhou et al., "Incremental Circuit Simulation Analysis for Design Modification and Verification", *ISCAS-2009*, pp. 2753-2756. In this embodiment, the time step can be calculated based on the previous and next fundamental circuit state events as follows:

$$h_{k+1}=(\Delta x_i-\Delta x_k)(t_k-t_{i-1})/(\Delta x_k-\Delta x_{i-1}) \quad (4);$$

where $\Delta x_i=\bar{x}_i-x_i$ is a differential state value at the next fundamental circuit event $\bar{x}_i$, and $\Delta x_{i-1}$ is a differential state value at the previous fundamental circuit event $\bar{x}_{i-1}$.

Figure 5A:
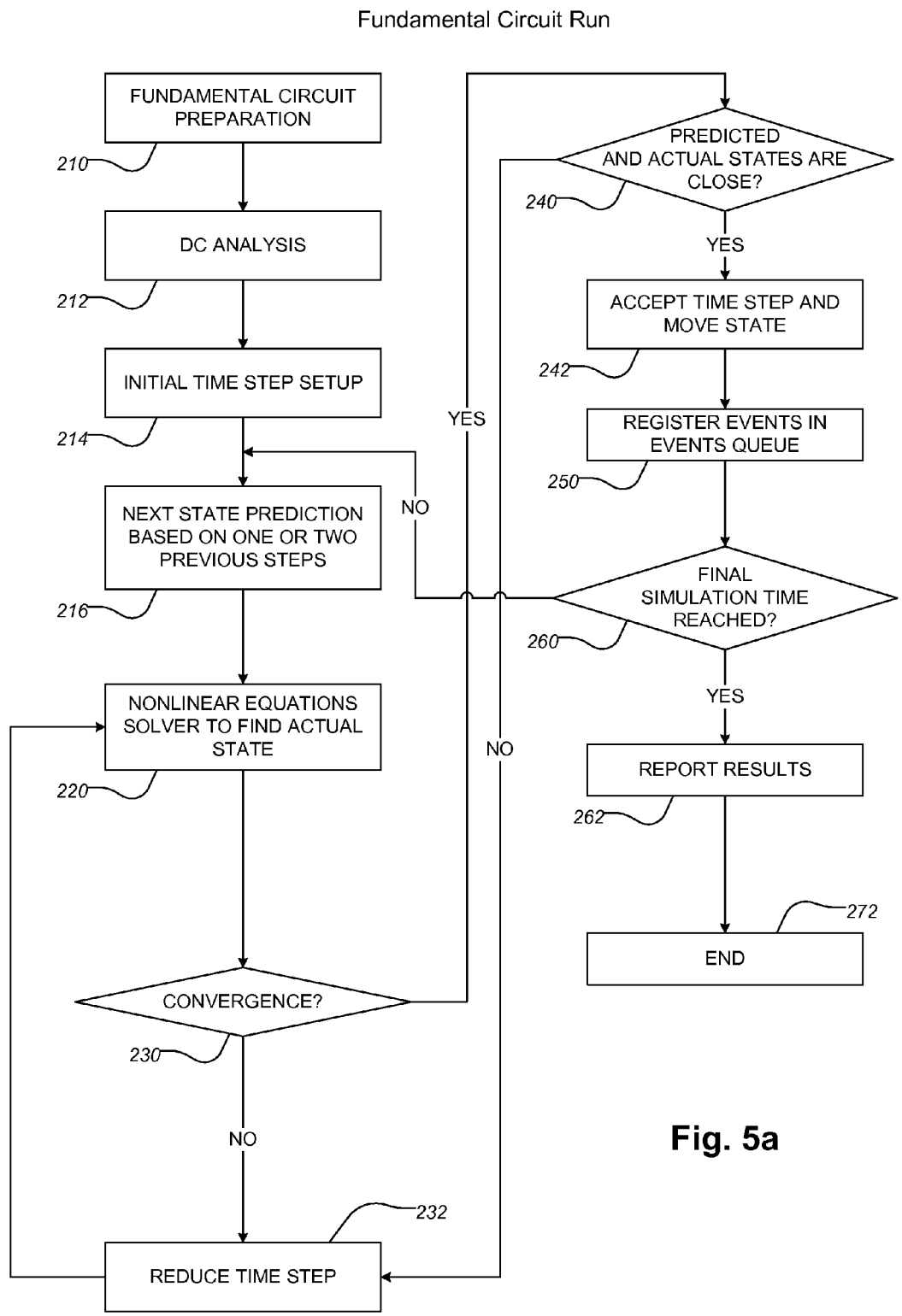
FIG. 5*a* is a flow diagram of the transient analysis of the fundamental circuit in accordance with one embodiment.
Figure 5B:
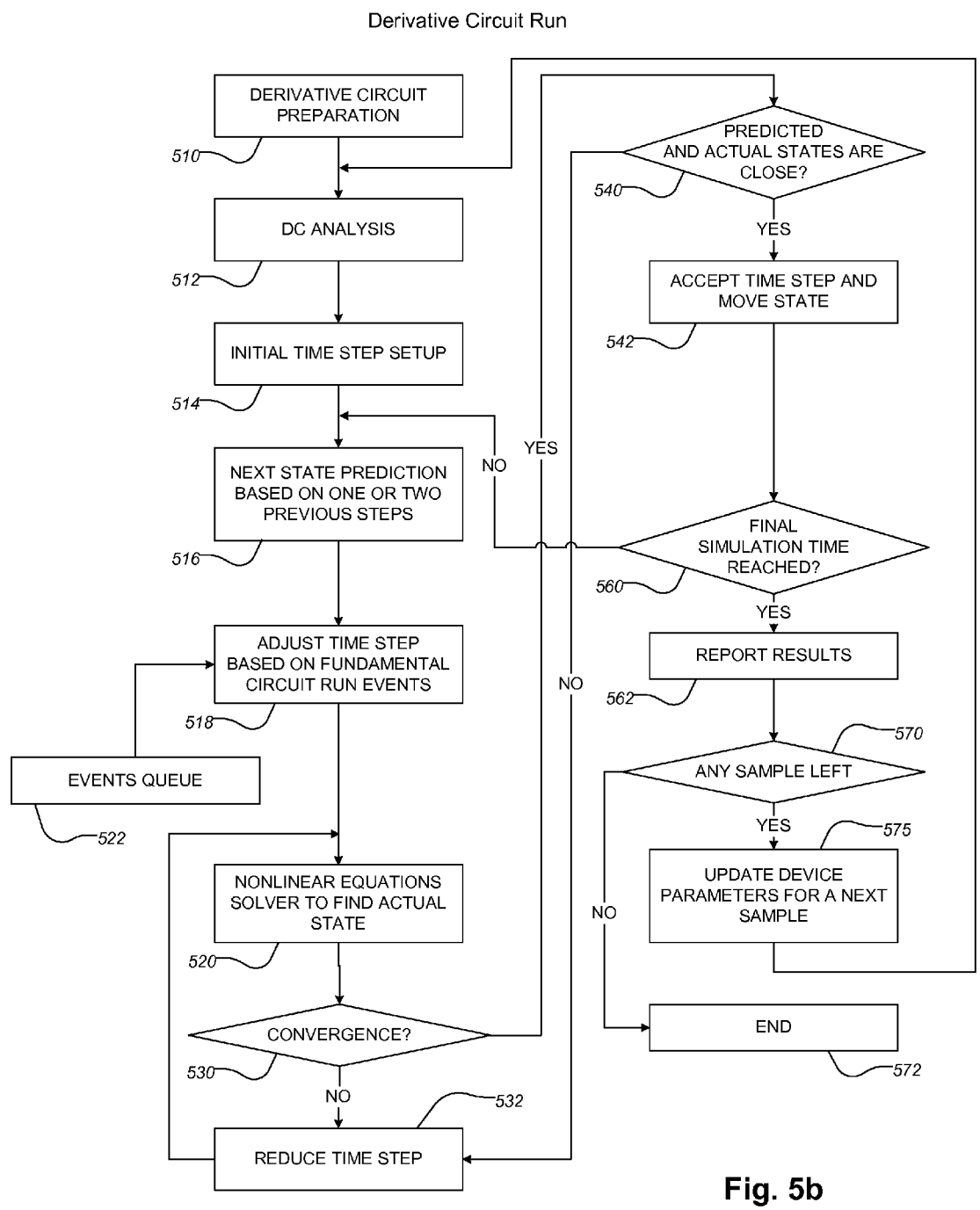
FIG. 5*b* is a flow diagram of the transient analysis of the derivative circuits, and includes modified time step selection during the analysis in accordance with one embodiment.

FIGS. 5a and 5b are flow diagrams of the functionality of circuit simulation module 134 of system 100 of FIG. 1 for time step selection in accordance with one embodiment. As described above, module 134 includes instructions which, when executed by processor 120, can carry out a statistical simulation process to select time steps during transient analysis of a fundamental circuit run and multiple derivative circuit runs according with one embodiment. FIG. 5a is a flow diagram of the transient analysis of the fundamental circuit in accordance with one embodiment. FIG. 5b is a flow diagram of the transient analysis of the derivative circuits, and includes modified time step selection during the analysis in accordance with one embodiment.

Referring to FIG. 5a, preparation is made for the transient analysis of the fundamental circuit where all devices have their original parameters, as described above. For example, system 100 prepares the fundamental circuit (at 210) by, for example, preparing an input vector of the original parameters. The input vector can include initial device parameters such as thermal properties (e.g., thermal capacitance and resistance), voltage and current elements, charge elements, etc. The input vector with parameters may be retrieved from a device model library. System 100 then performs a direct current ("DC") operating point transient analysis (at 212) which results in an initial steady state solution for the circuit simulation corresponding to the input vector. System 100 then performs the setup of the initial time step (at 214). Then, a next state is predicted based on one or two previous time steps (at 216). Since the current transient analysis is a fundamental circuit run (i.e., the first simulation run), system 100 uses a nonlinear equations solver to find the actual state (at 220).

When there is no convergence (No at 230), system 100 reduces the time step (at 232), and the functionality loops back to finding the actual state (at 220) based on the reduced time step until there is convergence. When there is convergence (Yes at 230), system 100 determines whether the predicted state from 216 and the actual state from 220 is close (at 240) by, for example, determining whether a difference between the predicted state and the actual state is within a predetermined range. When the predicted state and the actual state are not close (No at 240), system 100 reduces the time step (at 232) and the functionality loops back to finding the actual state (at 220). In one embodiment, the predetermined range is a user defined value and is typically a very small state (voltage) value range of less than 0.01 volts.

When the difference between the predicted state and the actual state are close (Yes at 240), system 100 accepts the time step as a fundamental circuit event and registers/stores the fundamental circuit events in the events queue (at 250). System 100 determines whether the final simulation time (i.e., a predetermined time duration) has been reached (at 260). When the final simulation has not been reached (No at 260), the functionality loops back to predicting the next stage based on one or two previous steps (at 216). When the final simulation time has been reached (Yes at 260), system 100 reports the simulation result (at 262) and then ends the functionality (at 272).

Referring to FIG. 5b, preparation is made for the transient analysis of the derivative circuits, including a modified step selection. System 100 prepares the derivative circuit (at 510) by, for example, retrieving or generating the first input vector/sample. System 100 then performs a DC operating point transient analysis (at 512) which results in an initial steady state solution for the circuit simulation corresponding to the input vector. System 100 then performs the setup of the initial time step (at 514). Then, a next state is predicted based on one or two previous time steps (at 516).

System 100 then adjusts the time step based on the fundamental circuit run events (518) by retrieving the events from the events queue (at 522). The events were stored/registered in the events queue at 250 of FIG. 5a. System 100 then uses a nonlinear equations solver to find the actual state (at 520).

When there is no convergence (No at 530), system 100 reduces the time step (at 532), and the functionality loops back to finding the actual state (at 520) based on the reduced time step until there is convergence.

When there is convergence (Yes at 530), system 100 determines whether the predicted state from 516 and the actual state from 520 is close (at 540) by, for example, determining whether a difference between the predicted state and the actual state is within a predetermined range. When the predicted state and the actual state are not close (No at 540), system 100 reduces the time step (at 532) and the functionality loops back to finding the actual state (at 520). In one embodiment, the predetermined range is a user defined value and is typically a very small state (voltage) value range of less than 0.01 volts.

When the difference between the predicted state and the actual state are close (Yes at 540), system 100 accepts the time step and moves the state (at 542). For derivative circuit runs, 542 serves as a correction for explicit integration steps previously made.

When the final simulation has not been reached (No at 560), the functionality loops back to predicting the next stage based on one or two previous steps (at 516). When the final simulation has been reached (Yes at 560), system 100 reports the simulation result (at 562) and then ends the functionality (at 572) if no sample is left (No at 570). A "sample" or "input vector" is a set of parameters under statistical variations such as device model parameters, temperature, voltage, etc. If there are still one or more samples left (Yes at 570), system 100 updates device parameters to create a next sample or input vector (at 575), and functionality loops back to performing the DC analysis (at 512) for the "new" derivative circuit with new parameters based on the new sample.

One embodiment can be used in conjunction with the known Berkeley short-channel IGFET Model ("BSIM") family of MOSFET transistor models for integrated circuit design, disclosed in, for example, Sheu et al., "BSIM: Berkeley Short-Channel IGFET Model for MOS Transistors", *IEEE Journal of Solid State Circuits SC*-22, pp. 558-566 (August 1987). BSIM is computationally expensive due to having a large number of associated equations and floating point operations. Lookup table based transistor models are a known alternative to the analytical BSIM equations and are used in fast circuit simulation tools to reduce a simulation run time. Typically, a lookup table is pre-characterized for the entire anticipated states region using the original analytical BSIM equations according to an approximation grid built over the table entries space, and polynomial splines are used to evaluate a device model between the grid nodes. Known simulators use a top-down recursive procedure to build a non-uniform approximation grid with desired accuracy.

Known simulators start from the entire space region and evaluate the BSIM model at all end points (two per each dimension). Then the spline approximation is built over the region, and it is divided by half into two regions in each dimension following a binary tree approach. The BSIM model equations are exercised at the middle point to confirm the accuracy of the spline approximation, and the selected region is divided again into two smaller regions until the required accuracy is reached.

Known dynamic (on-demand) approaches can be used to build splines in certain regions that are actually exercised during the simulation of a particular circuit, especially for statistical simulation with multiple simulation runs where a high complexity pre-characterization approach for the entire region may cause significant run time and memory overhead.

In contrast to known simulators, in one embodiment a lookup table transistor model is built for each device on demand during the fundamental circuit run. Each device-specific lookup table is then built one time for all derivative circuit simulations. If derivative circuits are simulated in parallel, one instance of the lookup table is built for each parallel thread or process. Therefore, each subsequent derivative circuit run can reuse the lookup table that is employed for the previous run with some modification. For the existing lookup table, there is no need to proceed through the top-down process of performing the BSIM equations evaluation, as all regions are already in place. The approximation spline may still need to be rebuilt for the selected region, and the accuracy may need to be verified since the device parameters have changed. However, the number of expensive BSIM equation calls are reduced since they are performed at selectively lowest level (or leaf) regions only.

Figure 6:
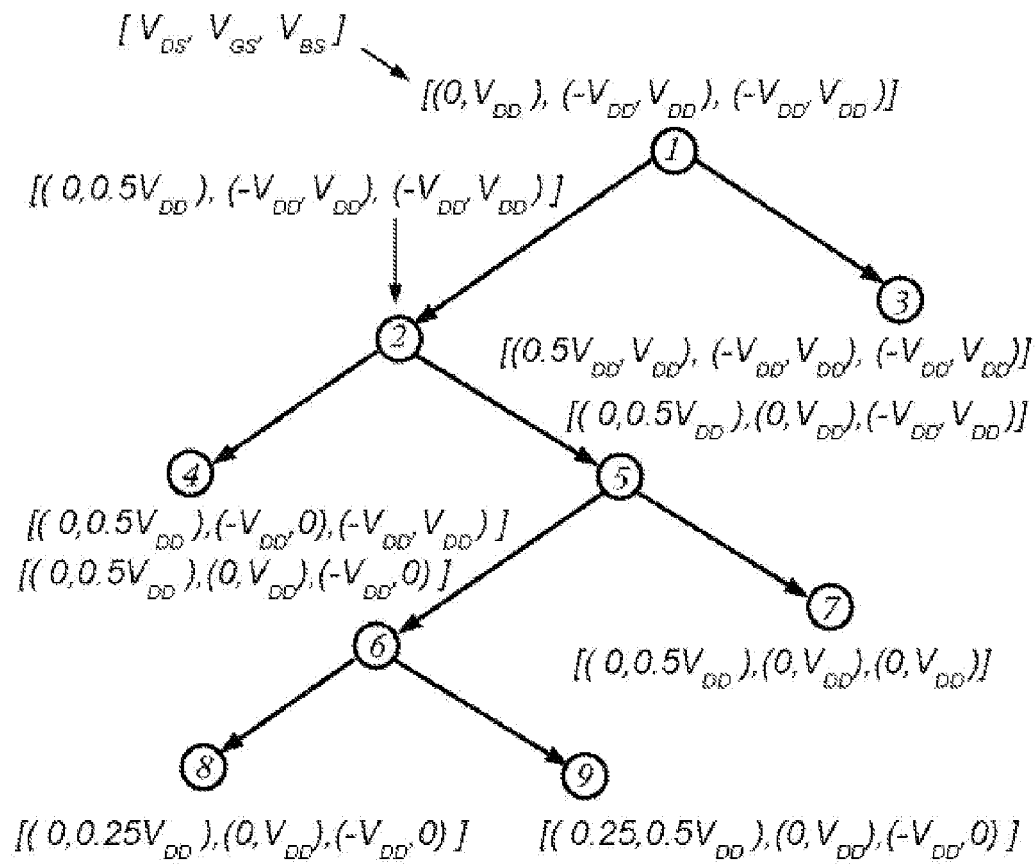
FIG. 6 illustrates original and modified lookup table construction algorithms for BSIM in accordance with one embodiment.

FIG. 6 illustrates original and modified lookup table construction algorithms for BSIM in accordance with one embodiment. Specifically, FIG. 6 illustrates an example of the dynamic lookup table MOSFET model construction procedure in a three-dimensional space when the entry point of $V_{DS}$, $V_{GS}$, $V_{BS}$ fit the region $[(0.25V_{DD}, 0.5V_{DD}), (0, V_{DD}), (-V_{DD}, 0)]$. The total number of BSIM calls is eleven (i.e., three at vertex 1 and two at vertices 2, 5, 6 and 9), when constructed in the first instance. The total number of BSIM calls is three (at vertex 9) when the existing table is reused in accordance with embodiments.

Figure 7:
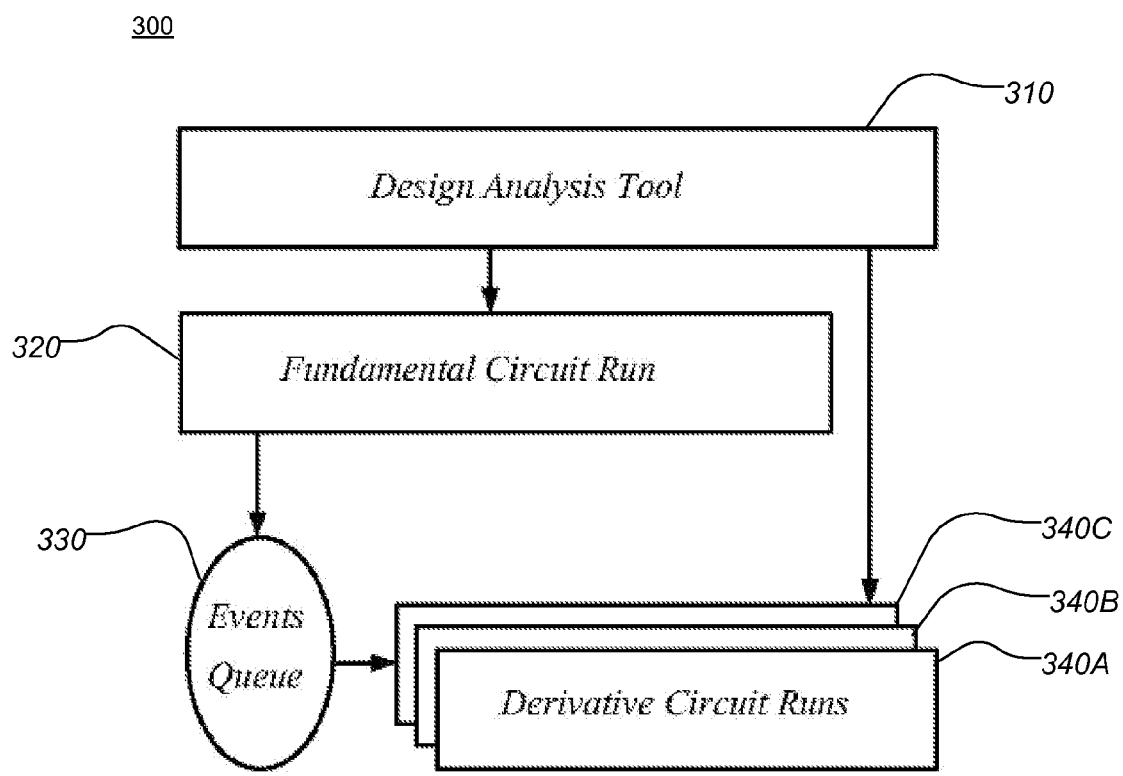
FIG. 7 illustrates an example concurrent simulation scenario in accordance with one embodiment.

In one embodiment, simulation runs can be performed in parallel with multiple threads or processes. FIG. 7 illustrates a simulator 300 in accordance with one embodiment, which includes a design analysis or simulation tool 310 and the events queue 330. Simulation tool 310 performs a fundamental circuit run 320 first to ensure that the events queue 330 is available in memory, for multiple threads, or on disk, for multiple processes. Then, simulation tool 310 performs a plurality of derivative circuit runs 340A, 340B, 340C independently from each other and in parallel, with limited data transferred a single time from the fundamental circuit run 320 to each derivative circuit run 340.

As disclosed, embodiments use a fundamental circuit simulation run to generate device parameters for use in subsequent derivative circuit simulation runs. Embodiments do not require the circuit states for all time points along with a partial circuit characteristic matrix transferred from fundamental to derivative circuits as is required in some known simulators. Instead, embodiments rely on only those states where a significant time derivative change occurred. Further, embodiments use a changing of the fundamental circuit event, and the corresponding derivative circuit integration time step is selected using a prediction based on the fundamental circuit results. Embodiments use an integrator for selecting circuit states. However, the selection is based on the events of the time derivative changes in the fundamental circuit run. Stability is ensured by the next time state derivative change event along with the implicit integrator triggered by that event. As a result, the effective time step is controlled by specific fundamental circuit events.

Several embodiments are specifically illustrated and/or described herein. However, it will be appreciated that modifications and variations of the disclosed embodiments are covered by the above teachings and within the purview of the appended claims without departing from the spirit and intended scope of the invention.

What is claimed is:

1. A non-transitory computer readable medium having instructions stored thereon that, when executed by a processor, cause the processor to simulate an integrated circuit comprising a plurality of devices, the simulating comprising:

performing a fundamental circuit simulation run using parameters for the plurality of devices and an initial time step, wherein the parameters for the fundamental circuit simulation are original stored parameters from a device model library that correspond to each of the devices;

generating one or more fundamental time steps from the fundamental circuit simulation run, wherein the fundamental time steps are generated when changes that indicate state time derivatives during two or more successive integration steps are within a predetermined range;

reducing the initial time step when state time derivatives during two or more successive integration steps are not within a predetermined range during the fundamental circuit simulation run;

storing the one or more fundamental time steps as fundamental circuit events in an events queue;

updating the parameters for the plurality of devices based on the fundamental circuit events to generate one or more derivative circuits; and performing one or more derivative circuit simulation runs using the derivative circuits, wherein the derivative circuit comprises the updated parameters that differ from the original stored parameters.

2. The non-transitory computer readable medium of claim 1, further comprising:

determining actual states the devices;

comparing the actual states to a next state prediction; and determining if the actual states and the next state prediction has converged.

3. The non-transitory computer readable medium of claim 2, wherein the actual state is determined using a nonlinear equations solver.

4. The non-transitory computer readable medium of claim 1, wherein the changes that indicate state time derivatives during two or more successive integration steps are within the predetermined range are determined using: $h_{k+1}=(\bar{x}_i-x_k)(t_k-t_{k-1})/(x_k-x_{k-1})$.

5. The non-transitory computer readable medium of claim 1, wherein the fundamental circuit simulation run and the one or more derivative circuit simulation runs comprise a transient analysis.

6. The non-transitory computer readable medium of claim 1, further comprising:

performing time domain integration using the differential state variables $\Delta x = \bar{x} - x$;

wherein the fundamental time steps are generated based on previous and next fundamental circuit state events comprising:

$$h_{k+1}=(\Delta x_i-\Delta x_k)(t_k-t_{i-1})/(\Delta x_k-\Delta x_{i-1}).$$

7. The non-transitory computer readable medium of claim 1, further comprising;

generating a lookup table of parameters for each of the devices in response to the fundamental circuit run; and using the lookup table during the one or more derivative circuit simulation runs.

8. The non-transitory computer readable medium of claim 1, wherein the performing one or more derivative circuit simulation runs using the derivative circuits is executed in parallel.

9. The non-transitory computer readable medium of claim 1, wherein the performing one or more derivative circuit simulation runs using the derivative circuits comprises adjusting a derivative time step based on the fundamental circuit events.

10. A computer implemented method for performing a transient analysis of an integrated circuit comprising a plurality of devices, the method comprising:

performing by a processor a fundamental circuit simulation run using original device parameters for the plurality of devices and an initial time step, wherein the parameters for the fundamental circuit simulation are original stored parameters from a device model library that correspond to each of the devices;

reducing by the processor the initial time step when state time derivatives during two or more successive integration steps are not within a predetermined range during the fundamental circuit simulation run;

generating by the processor one or more fundamental time steps from the fundamental circuit simulation run, wherein the fundamental time steps are generated when a predicted and an actual state are within a predetermined range;

registering the one or more fundamental time steps as fundamental circuit events in an events queue;

adjusting a time step based on the fundamental circuit events; and performing one or more derivative circuit simulation runs using derivative circuits and the adjusted time step, wherein the derivative circuit comprises the updated parameters that differ from the original stored parameters.

11. The method of claim 10, wherein the actual state is determined using a nonlinear equations solver.

12. The method of claim 10, wherein the fundamental time steps are generated when changes that indicate state time derivatives during two or more successive integration steps are within the predetermined range.

13. The method of claim 10, further comprising;

generating a lookup table of parameters for each of the devices in response to the fundamental circuit run; and using the lookup table during the one or more derivative circuit simulation runs.

14. The method of claim 10, wherein the performing one or more derivative circuit simulation runs using the derivative circuits is executed in parallel.

15. An integrated circuit simulation system comprising:
a processor;
a non-transitory computer readable medium coupled to the process and storing modules that are executed by the processor;
a fundamental circuit simulation run module executed by the processor for performing a fundamental circuit simulation run using original device parameters for the plurality of devices and an initial time step, wherein the parameters for the fundamental circuit simulation are original stored parameters from a device model library that correspond to each of the devices;
reducing the initial time step when state time derivatives during two or more successive integration steps are not within a predetermined range during the fundamental circuit simulation run;
a fundamental time step generator executed by the processor for generating one or more fundamental time steps from the fundamental circuit simulation run, wherein the fundamental time steps are generated when a predicted and an actual state are within a predetermined range;
an events queue for registering the one or more fundamental time steps as fundamental circuit events; and
a derivative circuit simulation run module for performing one or more derivative circuit simulation runs using derivative circuits and an adjusted time step that is adjusted based on the fundamental circuit events, wherein the derivative circuit comprises the updated parameters that differ from the original stored parameters.

16. The system of claim 15, wherein the actual state is determined using a nonlinear equations solver.

17. The system of claim 16, wherein the fundamental time steps are generated when changes that indicate state time derivatives during two or more successive integration steps are within the predetermined range.

18. The system of claim 15, further comprising;

generating a lookup table of parameters for each of the devices in response to the fundamental circuit run; and using the lookup table during the one or more derivative circuit simulation runs.

19. The system of claim 15, wherein the performing one or more derivative circuit simulation runs using the derivative circuits is executed in parallel.

* * * * *

UNITED STATES PATENT AND TRADEMARK OFFICE
CERTIFICATE OF CORRECTION

PATENT NO.           : 8,645,883 B2                                    Page 1 of 1
APPLICATION NO.      : 13/466295
DATED                : February 4, 2014
INVENTOR(S)          : Korobkov et al.

It is certified that error appears in the above-identified patent and that said Letters Patent is hereby corrected as shown below:

Title page, item (56), column 2, under Other Publications, line 4, delete "Simulatin" and insert
-- Simulation --, therefor.

Title page, item (56), column 2, under Other Publications, line 7, delete "Simulatin" and insert
-- Simulation --, therefor.

Signed and Sealed this
Twenty-fourth Day of June, 2014

Michelle K. Lee
*Deputy Director of the United States Patent and Trademark Office*